(12) United States Patent
Yang et al.

(10) Patent No.: US 12,131,783 B2
(45) Date of Patent: Oct. 29, 2024

(54) EARLY DISCHARGE SEQUENCES DURING READ RECOVERY TO ALLEVIATE LATENT READ DISTURB

(71) Applicant: Micron Technology, Inc., Boise, ID (US)

(72) Inventors: Xiangyu Yang, San Jose, CA (US); Ching-Huang Lu, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 151 days.

(21) Appl. No.: 17/540,752

(22) Filed: Dec. 2, 2021

(65) Prior Publication Data

US 2022/0392530 A1 Dec. 8, 2022

Related U.S. Application Data

(60) Provisional application No. 63/208,198, filed on Jun. 8, 2021.

(51) Int. Cl.
*G11C 16/34* (2006.01)
*G11C 16/04* (2006.01)
*G11C 16/08* (2006.01)
*G11C 16/26* (2006.01)

(52) U.S. Cl.
CPC .......... *G11C 16/08* (2013.01); *G11C 16/0483* (2013.01); *G11C 16/26* (2013.01); *G11C 16/3427* (2013.01)

(58) Field of Classification Search
CPC .......................... G11C 16/26; G11C 16/3427
USPC ...................................... 365/185.02
See application file for complete search history.

(56) References Cited

U.S. PATENT DOCUMENTS 9,761,320 B1 * 9/2017 Chen ................ G11C 16/3459
2012/0250414 A1 * 10/2012 Khandelwal .......... G11C 16/26
365/185.17

* cited by examiner

*Primary Examiner* — Anthan Tran
(74) *Attorney, Agent, or Firm* — Lowenstein Sandler LLP

(57) ABSTRACT

A memory device includes a memory array and control logic, operatively coupled with the memory array, to perform operations including initiating a read recovery process associated with a block of the memory array. The block includes wordlines at an initial voltage. The operations further include causing an early discharge sequence to be performed on a first set of wordlines of the wordlines during the read recovery process to alleviate latent read disturb. The early discharge sequence includes ramping the first set of wordlines from the initial voltage to a ramping voltage while maintaining a second set of wordlines of the wordlines at the initial voltage.

6 Claims, 10 Drawing Sheets

EARLY DISCHARGE SEQUENCES DURING READ RECOVERY TO ALLEVIATE LATENT READ DISTURB

RELATED APPLICATION

This application claims the benefit of U.S. Provisional Application 63/208,198 filed on Jun. 8, 2021, the entire content of which is incorporated by reference herein.

TECHNICAL FIELD

Embodiments of the disclosure relate generally to memory sub-systems, and more specifically, relate to early discharge sequences during read recovery to alleviate latent read disturb in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
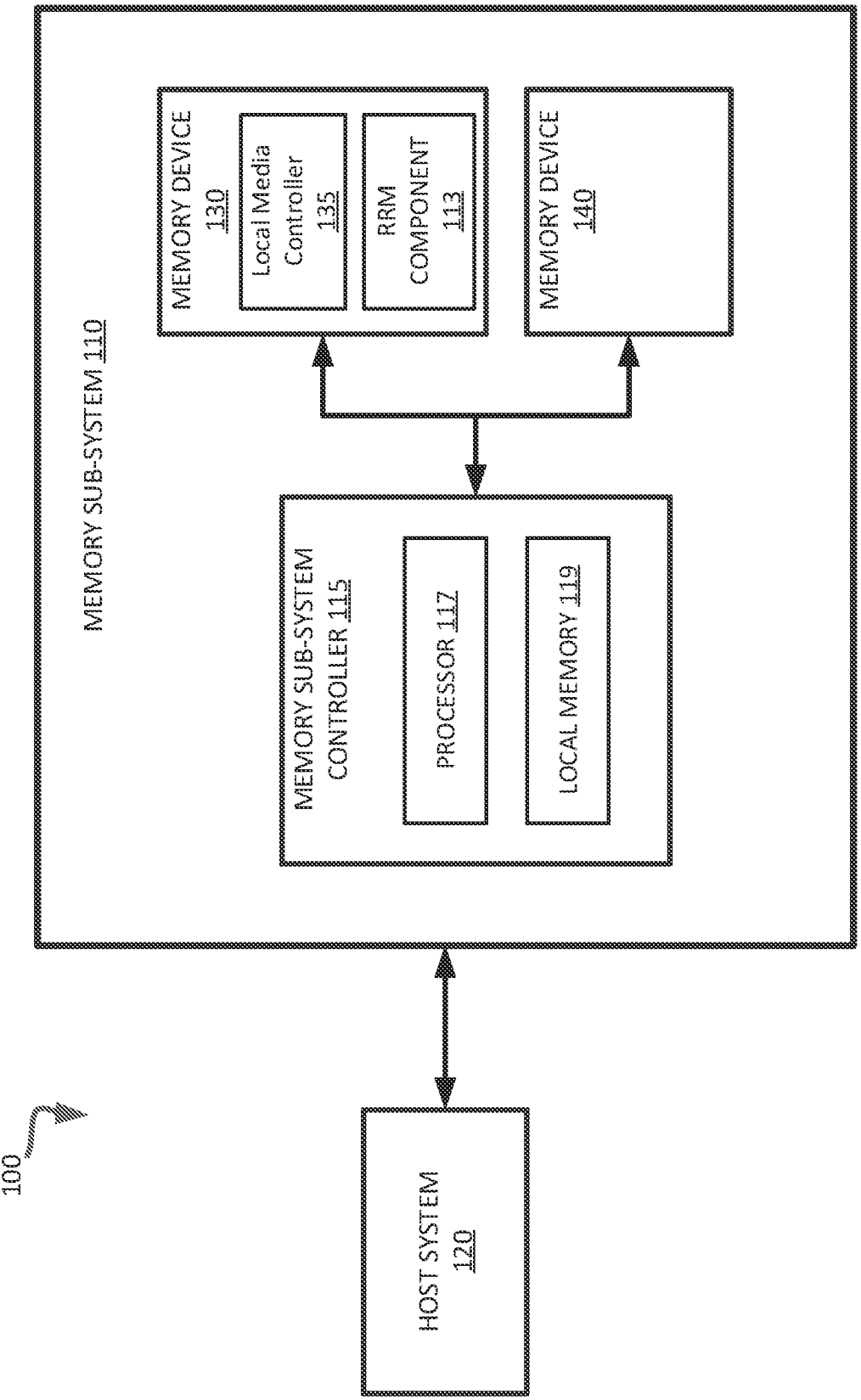
FIG. 1 illustrates an example computing system that includes a memory sub-system in accordance with some embodiments of the present disclosure.

Aspects of the present disclosure are directed to early discharge sequences during read recovery to alleviate latent read disturb in a memory sub-system. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include multiple bits arranged in a two-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

A cell (e.g., NAND cell) of a block can store data in the form of a threshold voltage, which is a lowest voltage at which the cell can be activated (i.e., switched on). During a read operation of a cell (i.e. a "read cell"), a read reference voltage ($V_{ref}$) can be applied to an associated wordline, and a sense amplifier connected to an associated bitline can be used to sense whether the read cell has been switched on. More specifically, if $V_{ref}$ is higher than a threshold voltage (Vt) of the read cell, then the read cell is turned on. It is noted that only one cell per bitline can be read at a time. Since the cells of a bitline are connected in series, all transistors for cells of the bitline that are not being read ("unread cells") need to be kept on during the read operation in order for the read output of the read cell to pass-through to the sense amplifier. To achieve this, a pass-through voltage ($V_{pass}$) can be applied to the wordlines of the unread cells to keep the unread cells on. More specifically, $V_{pass}$ is a voltage that is chosen to be higher than all of the Vt's of the unread cells, but lower than a programming voltage. Although $V_{pass}$ is a lower voltage than the programming voltage, the application of $V_{pass}$ can affect (e.g., increase) the Vt's and thus alter logic states of the unread cells of the block via tunneling currents. This phenomenon is referred to as "read disturb." As more read operations are applied within the block, the accumulation of read disturb over time can lead to read disturb errors.

Read recovery (RRCV) can be performed to implement an RRCV discharge sequence in an attempt to discharge the residual electrons. In certain memory devices, all wordlines can have a same RRCV discharge sequence. More specifically, the RRCV discharge sequence can go from an initial voltage (e.g., pass-through reset voltage ($V_{pass\_rst}$)) after a first delay, to a ramping voltage ($V_{ramp}$) (e.g., an internally generated supply voltage (referred to herein as $V_{int}$) or ground (GND)) after a second delay, and then to float after a third delay during RRCV. When all wordlines discharge at the same time, channel potential recovery relies on leakage through the source/drain. This channel potential recovery can be extremely slow for wordlines.

However, since the poly-silicon channel of a charge storage structure in some non-volatile memory devices is a floating channel that may not be connected to a bulk grounded body (e.g., as the pillar channel region in three-dimensional (3D) NAND devices), there is generally no path for the residual electrons in the channel region (e.g., electrons trapped or otherwise remaining inside the poly-silicon channel after an earlier read operation) to discharge other than through towards the source and/or drain of the memory string. Assuming that the wordline is ramped to $V_{ramp}$, the channel can become negatively boosted after RRCV when using a typical RRCV discharge sequence. The electrical field between the wordlines and the negatively boosted channel caused by the residual electrons can generate what is referred to herein as "latent read disturb." Similar to read disturb, latent read disturb can result in read errors and other potential device issues. Although the electrical field can be low, the electrical field can be present for orders of magnitude longer than a read, and it can be sustained by another read. Accordingly, latent read disturb can be an issue for devices such as 3D NAND devices due to the floating body effect.

Aspects of the present disclosure address the above and other deficiencies by implementing early discharge sequences during read recovery to alleviate latent read disturb. More specifically, at least one set of wordlines can be discharged early during a first recovery period such that the other wordlines and select gates are unchanged, and the RRCV waveform after the first recovery period is unchanged. This can allow the channel potential to recover when the other wordlines and select gates are on. More specifically, the channel potential can recover from both sides, resulting in less negative channel potential. Since the channel potential in this region becomes less negative after the early discharge, the electric field that can cause latent read disturb is alleviated (e.g., reduced). Additionally, the total delay can remain virtually unchanged, such that there is little to no time penalty. The early discharge sequences described herein can be implemented with any suitable memory device architecture in accordance with the embodiments described herein. In one embodiment, the early discharge sequences described herein can be implemented within a memory device implementing 3D NAND technology.

Advantages of the present disclosure include, but are not limited to, reduced read disturb effects, reduced read error rate, and overall improved memory device performance.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The local media controller 135 can implement a read recovery (RRCV) management (RRM) component 113. The RRM component 113 initiate read recovery operations that perform discharge sequences to alleviate or reduce latent read disturb associated with three-dimensional (3D) replacement gate memory devices (e.g., 3D NAND). More specifically, the discharge sequences include early discharge sequences, in which at least one set of wordlines can be discharged before other wordlines, while the other wordlines or select gates remain unchanged during a first delay. The at least one set of wordlines can correspond to a region with low $V_g V_t$ (i.e., the difference between wordline voltage ($V_g$) and threshold voltage ($V_t$)) and/or poor trap-up post-cycling. Trap-up post cycling refers to cycling degradation that results in lower $V_g V_t$ (cycled cells can be programmed to disturbed to a given $V_t$ at a lower $V_g$, which can increase vulnerability to read disturb). Moreover, the position of the at least one set of wordlines can be further away from the source and/or drain, which can make it difficult for the channel potential to recover.

To perform an early discharge sequence, the wordlines can initially have a same channel potential (e.g., 0 V), and the at least one set of wordlines can be ramped to a particular voltage ($V_{ramp}$). Early discharge of the at least one set of wordlines can lead to a change in channel potential in a region corresponding to the at least one set of wordlines. The channel potential in the region after the early discharge can recover on both sides (not just the set of wordlines), thereby alleviating latent read disturb. The RRCV waveform after the first delay can remain unchanged, and there may be little to no memory timing impact.

In some embodiments, a discharge sequence is an early discharge sequence to $V_{ramp}$. In some embodiments, $V_{ramp}$ is ground (GND). In some embodiments, $V_{ramp}$ is a negative voltage ($V_{neg}$). Further details regarding these embodiments will be described below with reference to FIGS. 3A-3B. In some embodiments, a discharge sequence is a staggered early discharge sequence. For example, the staggered early discharge sequence can be a symmetrically staggered early discharge sequence. Further details regarding these embodiments will be described below with reference to FIG. 4. In some embodiments, a discharge sequence is a two-step early discharge sequence. Further details regarding these embodiments will be described below with reference to FIG. 5. In some embodiments, a discharge sequence is a gradient early discharge sequence. Further details regarding these embodiments will be described below with reference to FIG. 6.

Figure 2A:
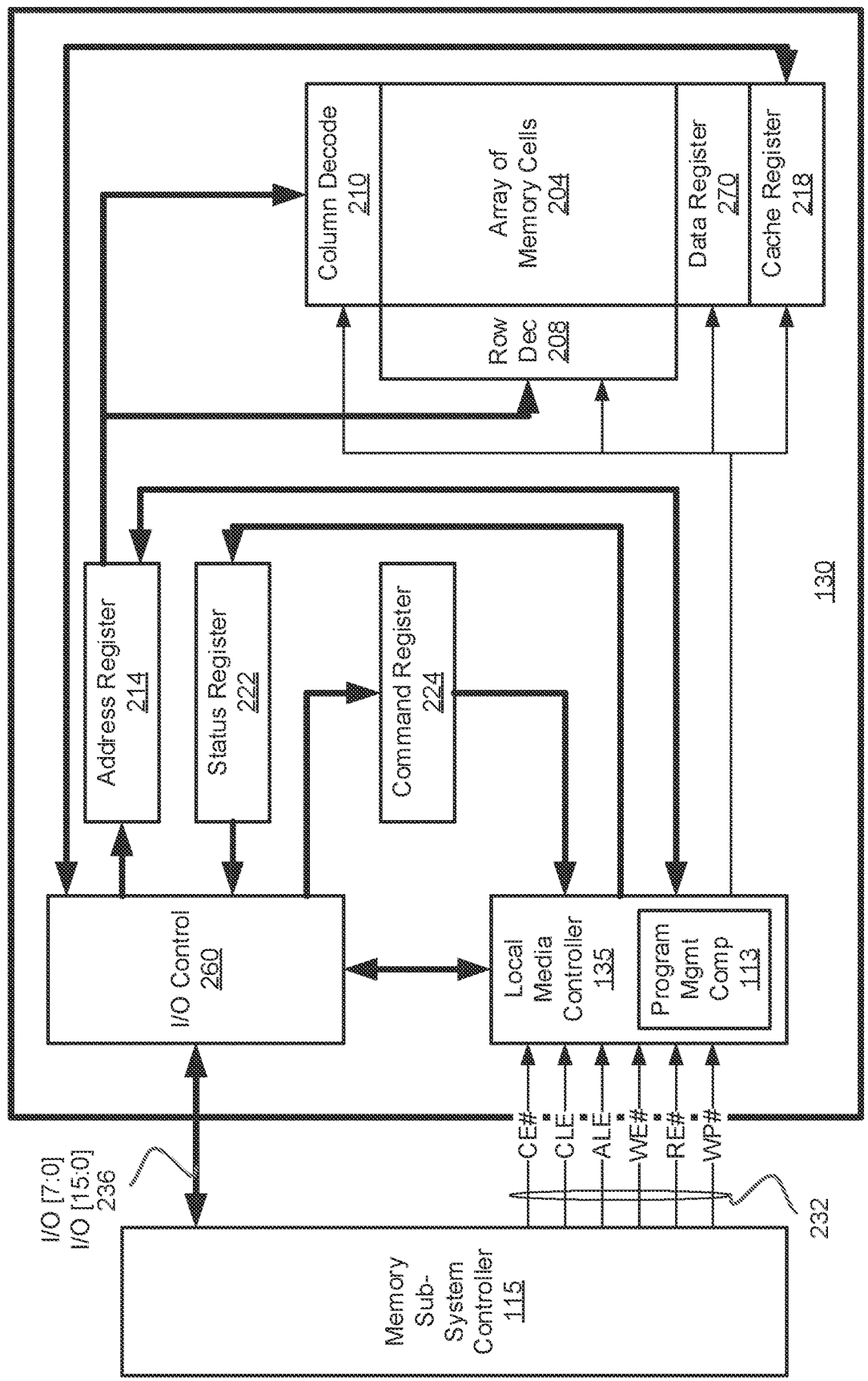
FIG. 2A is a block diagram of a memory device in communication with a memory sub-system controller of a memory sub-system in accordance with some embodiments of the present disclosure.

FIG. 2A is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 204 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 2A) of at least a portion of array of memory cells 204 are capable of being programmed to one of at least two target data states.

Row decode circuitry 208 and column decode circuitry 210 are provided to decode address signals. Address signals are received and decoded to access the array of memory cells 204. Memory device 130 also includes input/output (I/O) control circuitry 260 to manage input of commands, addresses and data to the memory device 130 as well as output of data and status information from the memory device 130. An address register 214 is in communication with I/O control circuitry 260 and row decode circuitry 208 and column decode circuitry 210 to latch the address signals prior to decoding. A command register 224 is in communication with I/O control circuitry 260 and local media controller 135 to latch incoming commands.

A controller (e.g., the local media controller 135 internal to the memory device 130) controls access to the array of memory cells 204 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 208 and column decode circuitry 210 to control the row decode circuitry 208 and column decode circuitry 210 in response to the addresses. In one embodiment, local media controller 134 includes the RRM component 113, which can implement the RRM described herein during a program operation on memory device 130.

The local media controller 135 is also in communication with a cache register 218. Cache register 218 latches data, either incoming or outgoing, as directed by the local media controller 135 to temporarily store data while the array of memory cells 204 is busy writing or reading, respectively, other data. During a program operation (e.g., write operation), data may be passed from the cache register 218 to the data register 270 for transfer to the array of memory cells 204; then new data may be latched in the cache register 218 from the I/O control circuitry 260. During a read operation, data may be passed from the cache register 218 to the I/O control circuitry 260 for output to the memory sub-system controller 115; then new data may be passed from the data register 270 to the cache register 218. The cache register 218 and/or the data register 270 may form (e.g., may form a portion of) a page buffer of the memory device 130. A page buffer may further include sensing devices (not shown in FIG. 2A) to sense a data state of a memory cell of the array of memory cells 204, e.g., by sensing a state of a data line connected to that memory cell. A status register 222 may be in communication with I/O control circuitry 260 and the local memory controller 135 to latch the status information for output to the memory sub-system controller 115.

Memory device 130 receives control signals at the memory sub-system controller 115 from the local media controller 135 over a control link 232. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 232 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 236 and outputs data to the memory sub-system controller 115 over I/O bus 236.

For example, the commands may be received over input/output (I/O) pins [7:0] of I/O bus 236 at I/O control circuitry 260 and may then be written into command register 224. The addresses may be received over input/output (I/O) pins [7:0] of I/O bus 236 at I/O control circuitry 260 and may then be written into address register 214. The data may be received over input/output (I/O) pins [7:0] for an 8-bit device or input/output (I/O) pins [15:0] for a 16-bit device at I/O control circuitry 260 and then may be written into cache register 218. The data may be subsequently written into data register 270 for programming the array of memory cells 204.

In an embodiment, cache register 218 may be omitted, and the data may be written directly into data register 270. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 2A has been simplified. It should be recognized that the functionality of the various block components described with reference to FIG. 2A may not necessarily be segregated to distinct components or component portions of an integrated circuit device. For example, a single component or component portion of an integrated circuit device could be adapted to perform the functionality of more than one block component of FIG. 2A. Alternatively, one or more components or component portions of an integrated circuit device could be combined to perform the functionality of a single block component of FIG. 2A. Additionally, while specific I/O pins are described in accordance with popular conventions for receipt and output of the various signals, it is noted that other combinations or numbers of I/O pins (or other I/O node structures) may be used in the various embodiments.

Figure 2B:
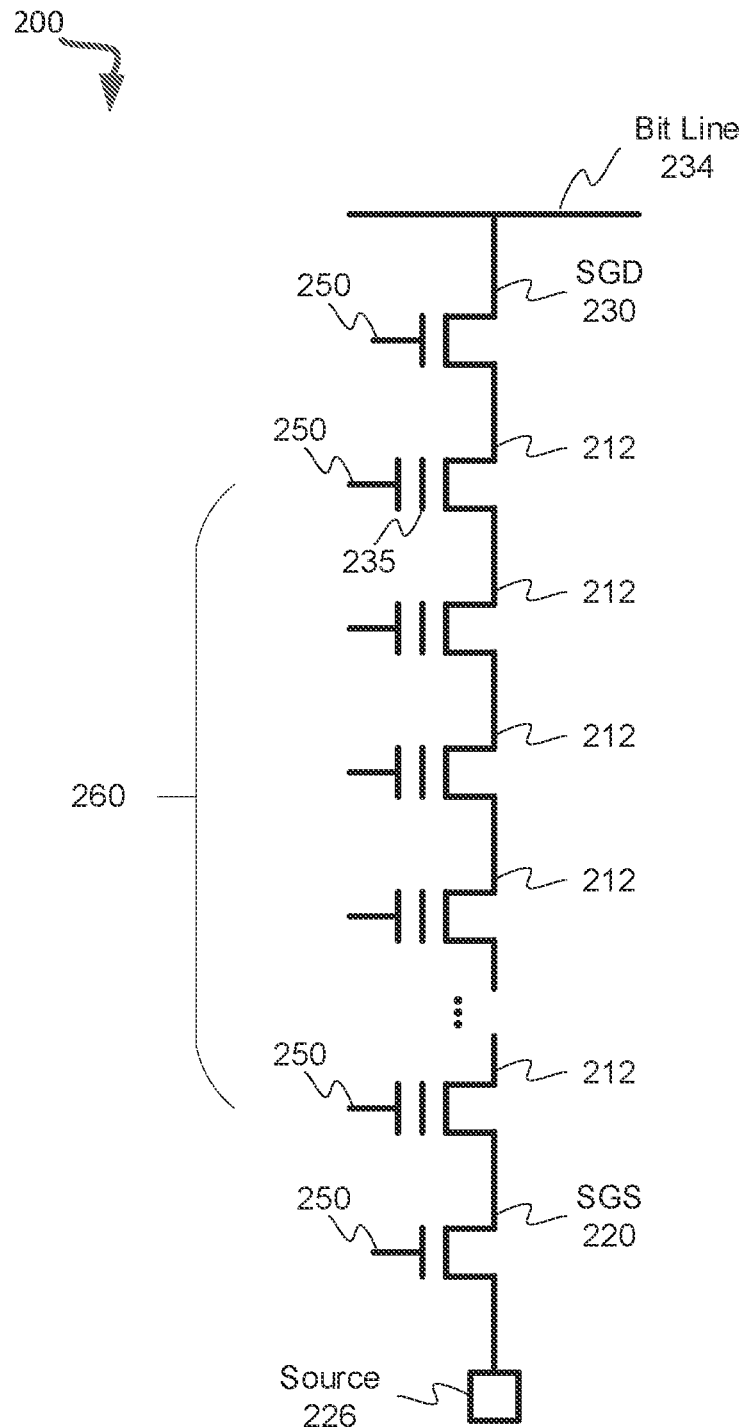
FIG. 2B is a schematic diagram illustrating a string of memory cells in a data block of a memory device in a memory sub-system in accordance with some embodiments of the present disclosure.

FIG. 2B is a schematic diagram illustrating a string 200 of memory cells in a data block of a memory device in a memory sub-system in accordance with some embodiments of the present disclosure. In one embodiment, the string 200 is representative of one portion of memory device 130, such as from array of memory cells 204, as shown in FIG. 2A. The string 200 includes a number of memory cells 212 (i.e., charge storage devices), such as up to 32 memory cells (or more) in some embodiments. The string 200 includes a source-side select transistor known as a select gate source 220 (SGS) (typically an n-channel transistor) coupled between a memory cell 212 at one end of the string 200 and a common source 226. The common source 226 may include, for example, a commonly doped semiconductor material and/or other conductive material. At the other end of the string 200, a drain-side select transistor called a select gate drain 230 (SGD) (typically an n-channel transistor) is coupled between one of the memory cells 212 and a data line 234, which is commonly referred to in the art as a "bit line." The common source 226 can be coupled to a reference voltage (e.g., ground voltage or simply "ground" [GND]) or a voltage source (e.g., a charge pump circuit or power supply which may be selectively configured to a particular voltage suitable for optimizing a programming operation, for example).

Each memory cell 212 may include, for example, a floating gate transistor or a charge trap transistor and may comprise a single level memory cell or a multilevel memory cell. The floating gate may be referred to as a charge storage structure 235. The memory cells 212, the source select gate 220, and the drain select gate 230 can be controlled by signals on their respective control gates 250.

Control signals can be applied to select lines (not shown), to select strings, or to access lines (not shown) to select memory cells 212, for example. In some cases, the control gates can form a portion of the select lines (for select devices) or access lines (for cells). The drain select gate 230 receives a voltage that can cause the drain select gate 230 to select or deselect the string 200. In one embodiment, each respective control gate 250 is connected to a separate wordline (i.e., access line), such that each device or memory cell can be separately controlled. The string 200 can be one of multiple strings of memory cells in a block of memory cells in memory device 130. For example, when multiple strings of memory cells are present, each memory cell 212 in string 200 may be connected to a corresponding shared wordline, to which a corresponding memory cell in each of the multiple strings is also connected. As such, if a selected memory cell in one of those multiple strings is being read, a corresponding unselected memory cell 212 in string 200 which is connected to the same wordline as the selected cell can be subjected to the same read voltage, potentially leading to read disturb effects For example, a bias can be applied to the string 200 during a read to turn on, e.g., the SGD 230 and the SGS 220. The electrical field created during the read can result in read disturb. The read disturb can result in threshold voltage shift on erased cells. After the read is finished, the bias is removed to turn off, e.g., the SDG 230 and the SGS 220. The wordlines between those connected to the SDG 230 and the SGS 220 correspond to a floating set of wordlines 260. A residual electrical field after the read can remain between the gate and the channel of the cells within the floating set of wordlines 260 to result in a negatively boosted channel. The residual electrical field can be caused by the coupling of the floating region with the wordlines during wordline ramping down, and sustained by a blockage of the electron discharge path. The residual electric field can result in latent read disturb, which can also result in threshold voltage shift on erased cells. As will be described in further detail herein, control signals applied by the RRM component 113, or at the direction of the RMM component 113, can be used to alleviate latent read disturb by apply voltages to wordlines in a sequence to discharge residual electrons from the channel of the string 200.

Figure 3A:
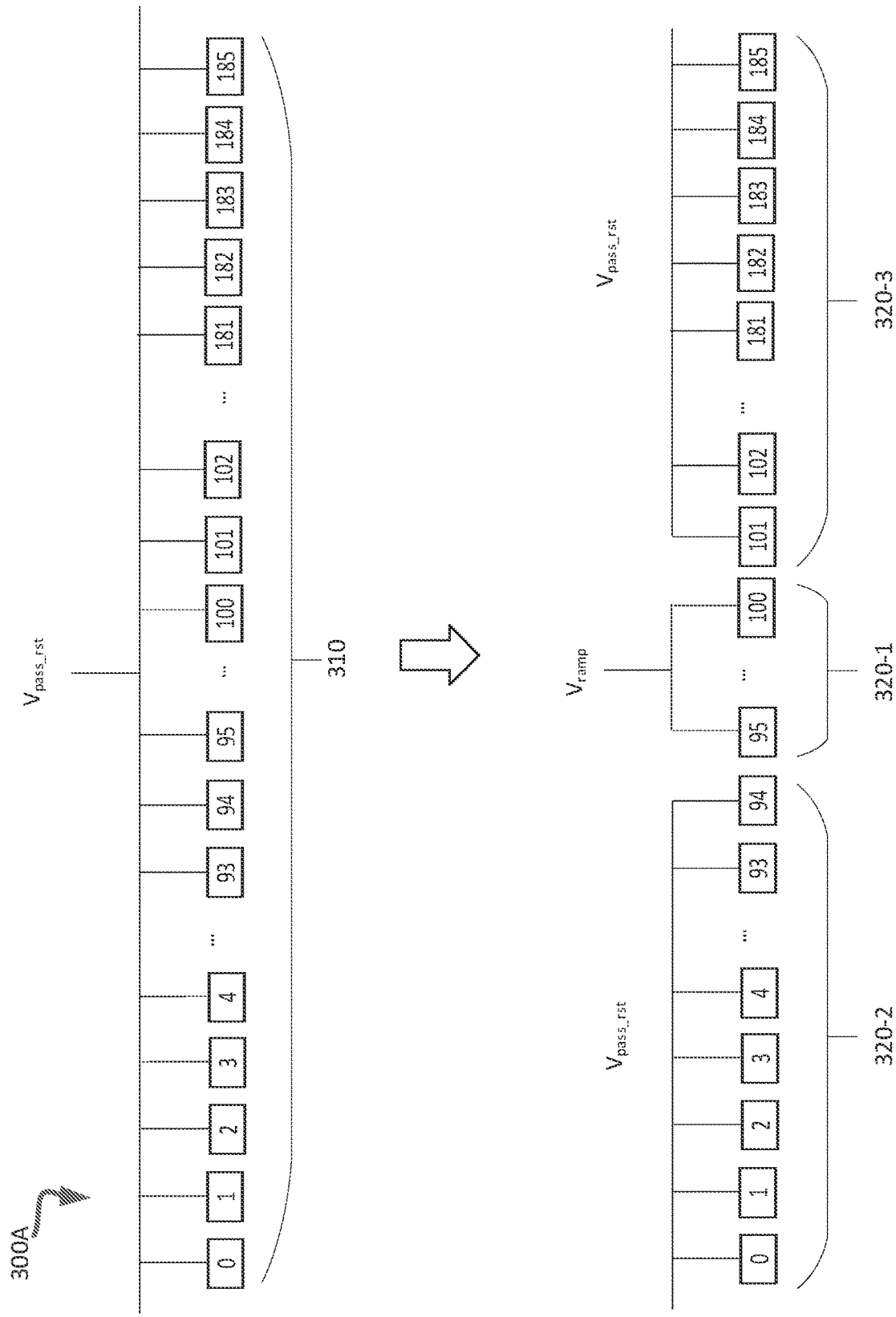
FIGS. 3A and 3B are diagrams illustrating the performance of an early discharge sequence during read recovery to alleviate latent read disturb in a memory sub-system in accordance with some embodiments of the present disclosure.

FIG. 3A is a diagram 300A illustrating the performance of an early discharge sequence during read recovery to alleviate latent read disturb in a memory sub-system in accordance with some embodiments of the present disclosure. As shown, a group of wordlines 310 ramped to an initial voltage. The initial voltage can be a voltage lower than $V_{pass}$. In this illustrative example, the initial voltage is a pass-through reset voltage ($V_{pass\_rst}$). $V_{pass\_rst}$ can have a voltage value chosen to be lower than $V_{pass}$, but should be able to barely turn on all of the cells. In some embodiments, $V_{pass\_rst}$ has a voltage value that is chosen to be about the $V_t$ of the highest programmed level. For example, $V_{pass\_rst}$ can range from about 4 V to about 5 V. The group of wordlines 310 can include data wordlines. For example, the group of wordlines 310 can be top deck wordlines of a 3D replacement gate memory device (e.g., 3D NAND). In this illustrative example, there are 185 wordlines in the group. However, such an example should not be considered limiting.

After a first delay, a set of wordlines 320-1 can be ramped to a ramping voltage ($V_{ramp}$). In some embodiments, the first delay ranges between about 0.3 microsecond to about 4 microseconds. For example, the first delay can range between about 1 microsecond and 2 microseconds. Remaining sets of wordlines 320-2 and 320-3 are maintained at $V_{pass\_rst}$. The purpose of $V_{ramp}$ is to push out electrons through the string. This is done so that the set of wordlines 320-1 can follow a different discharge sequence than the other sets of wordlines 320-2 320-3, in a manner that can address latent read disturb.

$V_{ramp}$ can be chosen to have a lower magnitude voltage than $V_{pass\_rst}$. In some embodiments, $V_{ramp}$ is ground (GND). In some embodiments, $V_{ramp}$ is a negative voltage ($V_{neg}$). $V_{neg}$ can range from, e.g., about –2.5 V to about –1 V. For example, $V_{neg}$ can be about –1 V.

The set of wordlines 320-1 can correspond to a region with low VgVt and/or poor trap-up post-cycling. For example, the set of wordlines 320-1 can correspond to a region in which electrons have the longest discharge path, which can be located toward the center of the string. The set of wordlines 320-1 can include at least one wordline. In this illustrative example, the set of wordlines 320-1 includes wordlines 95-100, the set of wordlines 320-2 includes wordlines 0-94, and the set of wordlines 320-3 includes wordlines 101-185.

Although not shown in FIG. 3A, after a second delay, the remaining sets of wordlines 320-2 and 320-3 can be ramped to $V_{ramp}$ to continue pushing the electrons toward the end(s) of the string. The second delay can be selected based on electron discharge speed. In some embodiments, the second delay ranges between about 0.3 microseconds to about 4 microseconds. For example, the second delay can range between about 1 microsecond to about 2 microseconds. This process of delaying the ramping of additional sets of wordlines can continue down the string until the electrons are discharged to the end(s) of the string. Ideally, the set of wordlines 320-1 includes a single wordline, such that the delay and ramping process can occur on a per-wordline basis about the set of wordlines 320-2 and 320-3. However, such a process can take a long time to perform. Thus, the number of wordlines in the set of wordlines 320-1 can be selected to achieve a suitable balance between timing and performance.

Figure 3B:
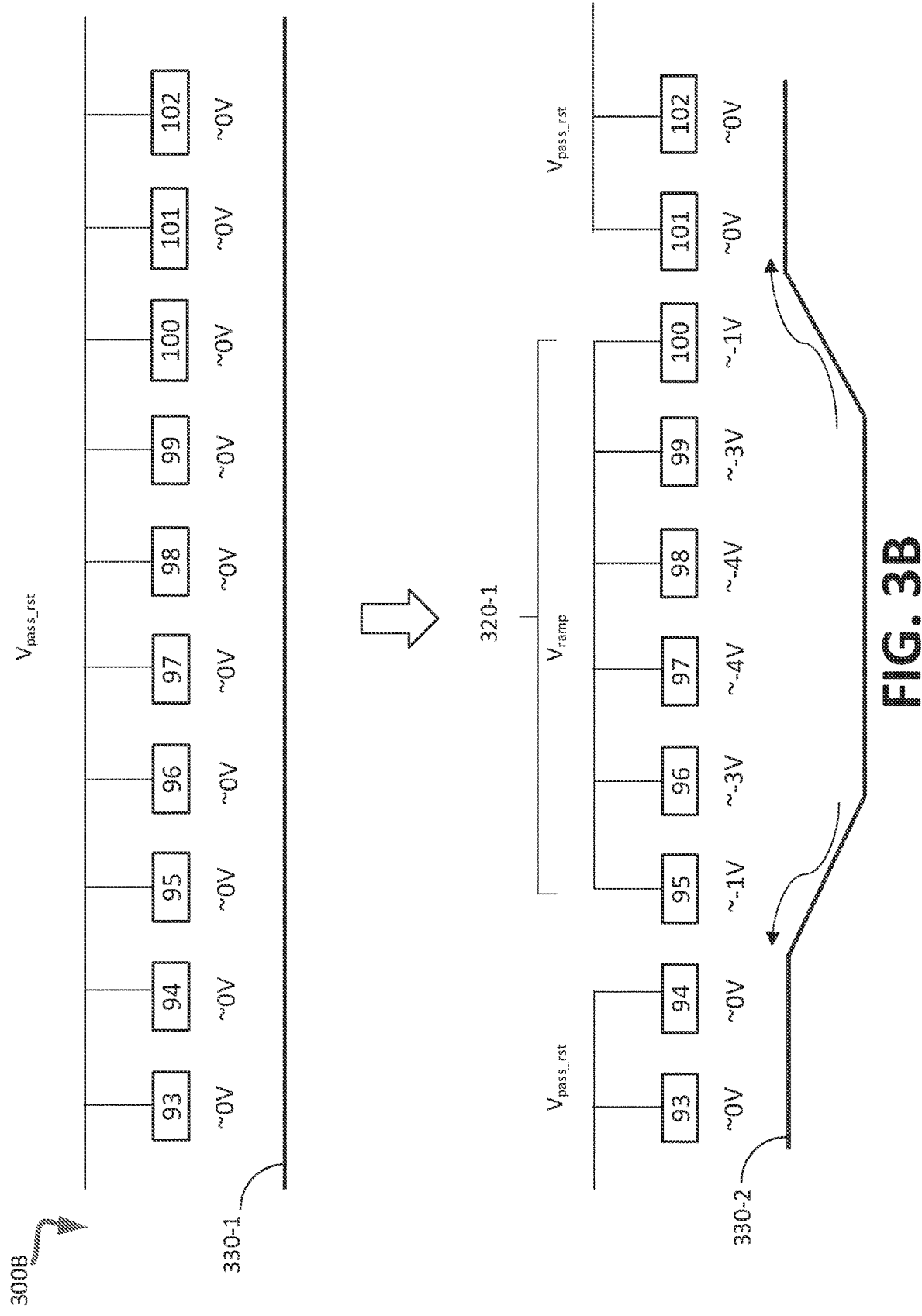

FIG. 3B is a diagram 300B illustrating the performance of the early discharge sequence to $V_{ramp}$ during read recovery to alleviate latent read disturb in a memory sub-system in accordance with some embodiments of the present disclosure. More specifically, FIG. 3B shows the evolution of the potential over a portion of the wordlines 93-102. In this illustrative example, the channel potential 330-1 across the portion of the wordlines starts at 0 V. However, this should not be considered limiting. Early discharge that occurs after ramping the set of wordlines 320-1 to $V_{ramp}$ can lead to a channel potential 330-2 having a negative channel potential region corresponding to the set of wordlines 320-1. In this illustrative example, the portion of the channel potential 330-2 corresponding to wordlines 97 and 98 is about –4 V, the portion of the channel potential 330-2 corresponding to wordlines 96 and 99 is about –3 V, and the portion of the channel potential 330-2 corresponding to wordlines 95 and 100 is about –1 V. However, these examples should not be considered limiting. The channel potential in the region after discharge can recover on both sides during the first delay. This can result in less negative channel potential in this region, thereby alleviating latent read disturb and the associated threshold voltage shift.

Figure 4:
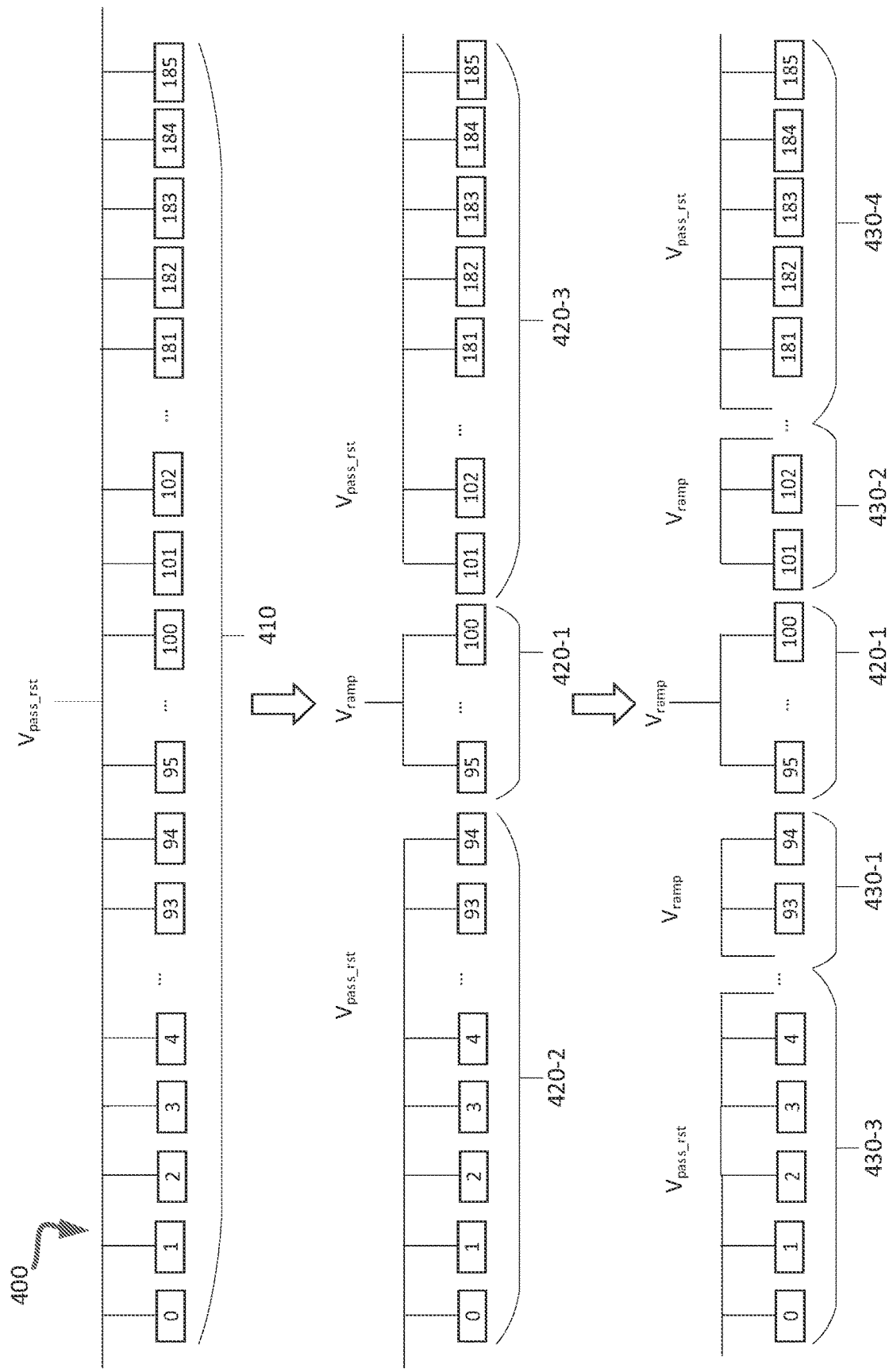
FIG. 4 is a diagram illustrating the performance of a staggered symmetric early discharge sequence during read recovery to alleviate latent read disturb in a memory sub-system in accordance with some embodiments of the present disclosure.

FIG. 4 is a diagram 400 illustrating the performance of a staggered early discharge sequence during read recovery to alleviate latent read disturb in a memory sub-system in accordance with some embodiments of the present disclosure. As shown, a group of wordlines 410 is initially at an initial voltage. In this illustrative example, the initial voltage is $V_{pass\_rst}$, as described in detail above with reference to FIG. 3A. In this illustrative example, there are 185 wordlines in the group. However, such an example should not be considered limiting. After a first delay, a set of wordlines 420-1 is ramped to $V_{ramp}$, similar to that described above with reference to FIG. 3A. Remaining sets of wordlines 420-2 and 420-3 are maintained at $V_{pass\_rst}$. In this illustrative example, the set of wordlines 420-1 includes wordlines 95-100, the set of wordlines 420-2 includes wordlines 0-94, and the set of wordlines 420-3 includes wordlines 101-185.

After a second delay, a first subset of wordlines 430-1 of the set of wordlines 420-2 is ramped to $V_{ramp}$, a second subset of wordlines 430-2 of the set of wordlines 420-3 is ramped to $V_{ramp}$, subset of wordlines 430-3 of the set of wordlines 420-2 and subset of wordlines 430-4 of the set of wordlines 420-3 remain at $V_{pass\_rst}$. In some embodiments, the second delay is between about 0.2 microseconds to about 2 microseconds. In some embodiments, the staggered early discharge sequence can be a symmetrically staggered early discharge sequence. More specifically, the subsets of wordlines 430-1 and 430-2 can include a same number of wordlines. For example, the subset of wordlines 430-1 can include 6 wordlines (89-94) and the subset of wordlines 430-2 can include 6 wordlines (101-106). However, such embodiments should not be considered limiting. Moreover, any suitable number of wordline discharge sequences can be added based on needs. The staggered discharge process can occur until all wordlines are ramped to $V_{ramp}$. For example, in some embodiments, the sets of wordlines 430-3 and 430-4 are ramped to $V_{ramp}$ together. In some embodiments, a subset of each of the sets of wordlines 430-3 and 430-4 are ramped to $V_{ramp}$. Then, after a delay, the remaining wordlines ramp down to $V_{ramp}$, or additional subsets can be ramped to $V_{ramp}$.

Figure 5:
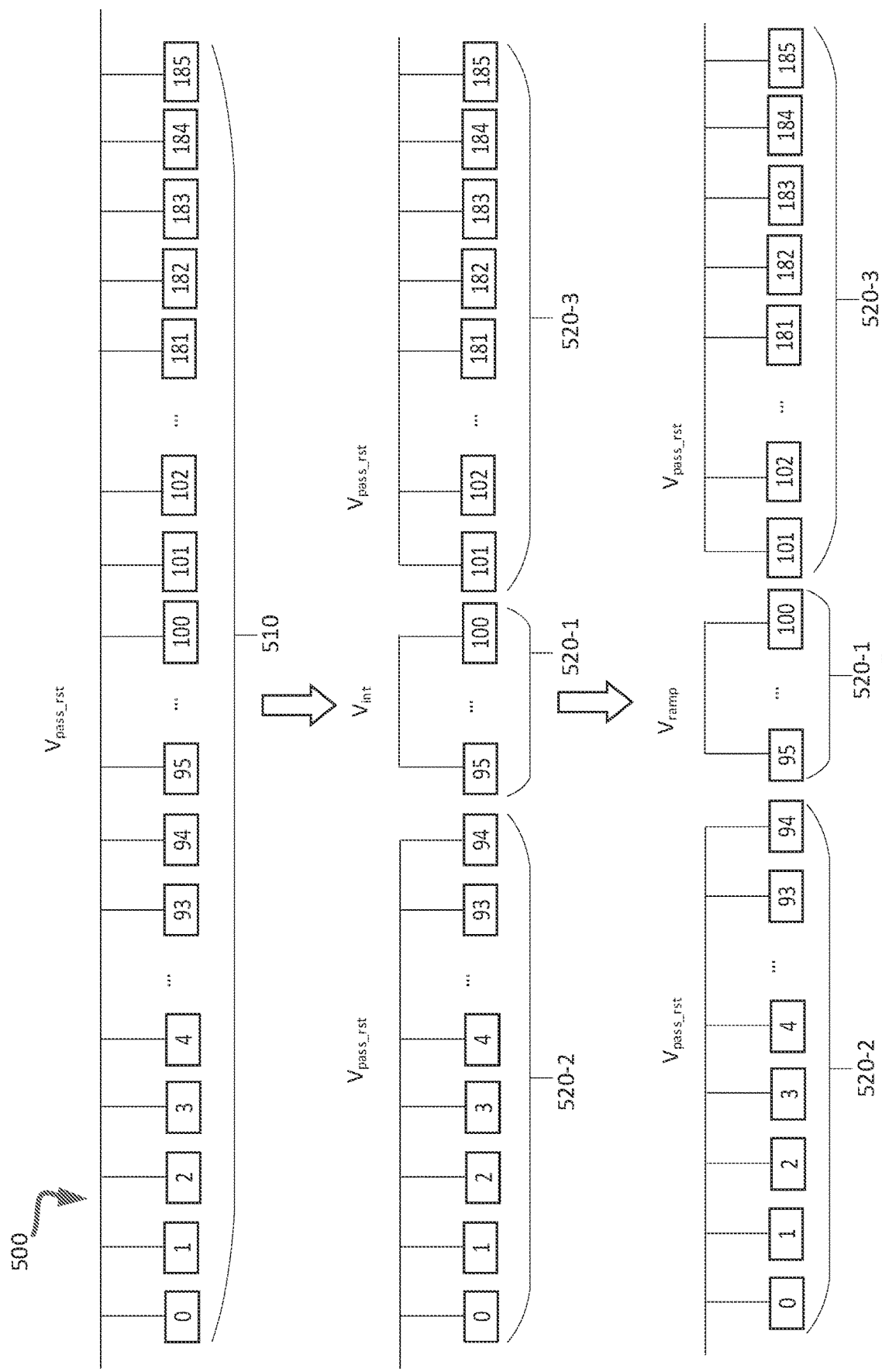
FIG. 5 is a diagram illustrating the performance of a two-step early discharge sequence during read recovery to alleviate latent read disturb in a memory sub-system in accordance with some embodiments of the present disclosure.

FIG. 5 is a diagram 500 illustrating the performance of a two-step early discharge sequence during read recovery to alleviate latent read disturb in a memory sub-system in accordance with some embodiments of the present disclosure. As shown, a group of wordlines 510 is initially at an initial voltage. In this illustrative example, the initial voltage is $V_{pass\_rst}$, as described in detail above with reference to FIG. 3A. In this illustrative example, there are 185 wordlines in the group. However, such an example should not be considered limiting. After a first delay, a set of wordlines 520-1 is ramped to an intermediate voltage $V_{int}$. The value of $V_{int}$ is between the initial voltage (e.g., $V_{pass\_rst}$) and $V_{ramp}$. For example, $V_{int}$ can be about 2 V. Remaining sets of wordlines 520-2 and 520-3 are maintained at the initial voltage (e.g., $V_{pass\_rst}$). In this illustrative example, the set of wordlines 520-1 includes wordlines 95-100, the set of wordlines 520-2 includes wordlines 0-94, and the set of wordlines 520-3 includes wordlines 101-185. After a second delay, the set of wordlines 520-1 is ramped to $V_{ramp}$, similar to that described above with reference to FIG. 3A. The other wordlines (e.g., sets of wordlines 520-2 and 520-3 can similarly be ramped to $V_{int}$ and then to $V_{ramp}$. The two-step early discharge sequence shown in FIG. 5 can reduce the possibility of hot carrier injection, in which a charge carrier (e.g., electron or hole) gains sufficient kinetic energy to break or tunnel through a potential barrier.

Figure 6:
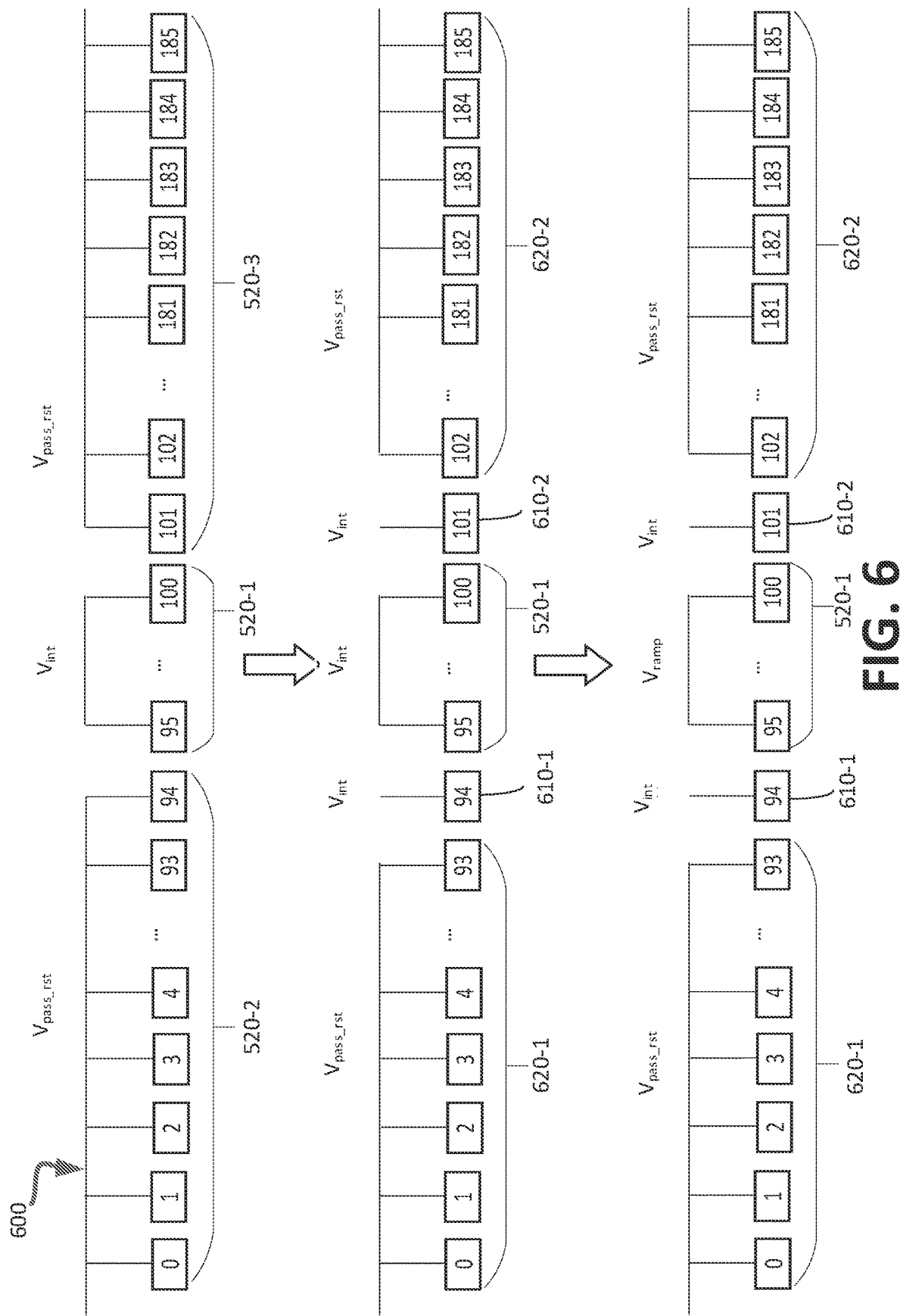
FIG. 6 is a diagram illustrating the performance of a gradient early discharge sequence during read recovery to alleviate latent read disturb in a memory sub-system in accordance with some embodiments of the present disclosure.

FIG. 6 is a diagram 600 illustrating the performance of a gradient early discharge sequence during read recovery to alleviate latent read disturb in a memory sub-system in accordance with some embodiments of the present disclosure. Here, it is assumed that the set of wordlines 520-1 from FIG. 5 have been ramped to $V_{int}$, such that there are remaining sets of wordlines 520-2 and 520-3. After a second delay, a second set of wordlines and a third set of wordlines can be ramped to $V_{int}$. The second set of wordlines can include at least one wordline adjacent to a "leftmost" wordline of the first set, and the third set of wordlines can include at least one wordline adjacent to a "rightmost" wordline of the first set. For example, the second set of wordlines can include a single wordline 610-1 and the third set of wordlines can include a single wordline 610-2. In this illustrative example, since the set of wordlines 520-1 includes wordlines 95-100, wordline 610-1 is wordline 94 and wordline 610-2 is wordline 95. After a third delay, the set of wordlines 520-1 is ramped to $V_{ramp}$ while the adjacent wordlines 610-1 and 610-2 remain at $V_{int}$. The additional discharge of the gradient early discharge sequence can be performed to further reduce the possibility of hot carrier injection.

Figure 7:
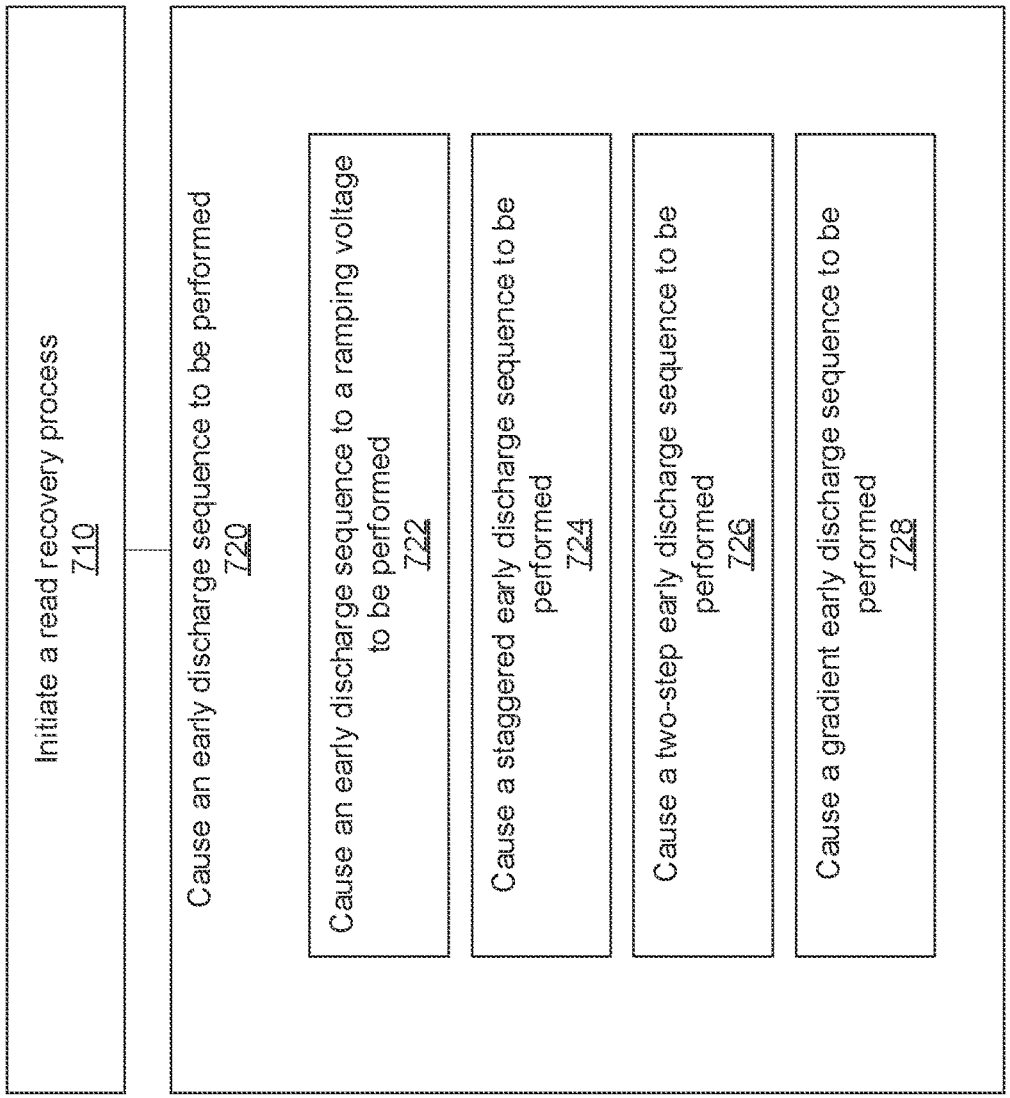
FIG. 7 is a flow diagram of a method to perform an early discharge sequence during read recovery to alleviate latent read disturb in a memory sub-system in accordance with some embodiments of the present disclosure.

FIG. 7 is a flow diagram of an example method 700 to perform an early discharge sequence during read recovery to alleviate latent read disturb in a memory sub-system in accordance with some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the RRM component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, a read recovery process is initiated. For example, the processing logic (e.g., RRM component 113) initiates a read recovery process associated with a block of a memory device.

At operation 720, an early discharge sequence is performed. For example, the processing logic causes an early discharge sequence to be performed on at least one set of wordlines of the block during the read recovery process. More specifically, the early discharge sequence can discharge the at least one set of wordlines to a particular voltage to alleviate latent read disturb. Any suitable early discharge sequence can be performed in accordance with the embodiments described herein.

In some embodiments, causing the early discharge sequence to be performed during the read recovery process can include, at operation 722, the processing logic causing a set of wordlines to be ramped to $V_{ramp}$ after a delay. Further details regarding operation 722 are described above with reference to FIGS. 3A-3B.

In some embodiments, causing the early discharge sequence to be performed during the read recovery process can include, at operation 724, the processing logic causing a staggered early discharge sequence to be performed. Further details regarding operation 724 are described above with reference to FIG. 4.

In some embodiments, causing the early discharge sequence to be performed during the read recovery process can include, at operation 726, the processing logic causing a two-step early discharge sequence to be performed. Further details regarding operation 726 are described above with reference to FIG. 5.

In some embodiments, causing the early discharge sequence to be performed during the read recovery process can include, at operation 728, the processing logic causing a gradient early discharge sequence to be performed. Further details regarding operation 728 are described above with reference to FIG. 6.

Figure 8:
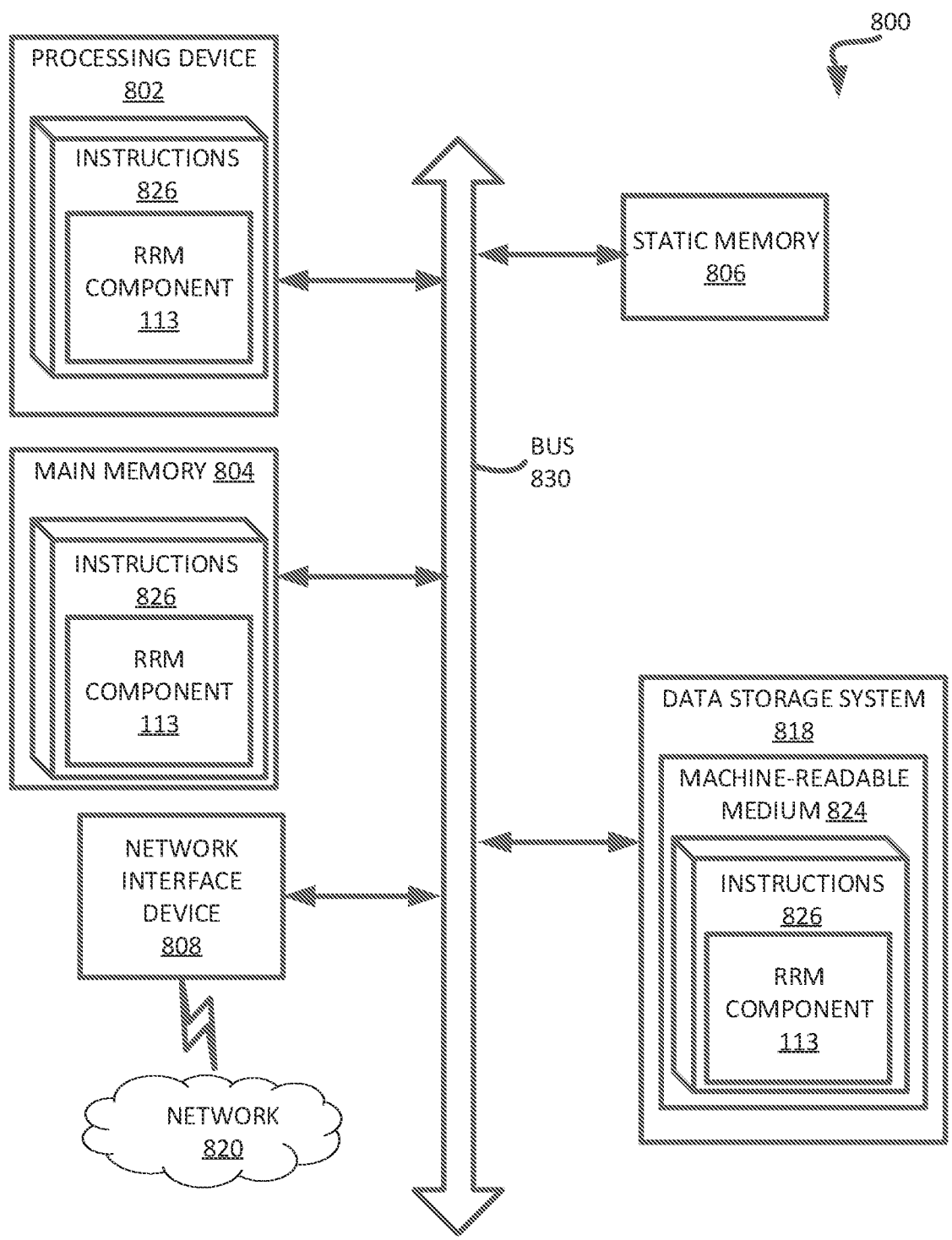
FIG. 8 is a block diagram of an example computer system in which embodiments of the present disclosure may operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the RRM component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or RDRAM, etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to a RRM component (e.g., the RRM component 113 of FIG. 1). While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a memory array; and
control logic, operatively coupled with the memory array, to perform operations comprising:
initiating a read recovery process with respect to a plurality of wordlines at an initial voltage, wherein the initial voltage is a pass-through reset voltage ($V_{pass\_rst}$) having a magnitude less than a pass-through voltage ($V_{pass}$); and
causing an early discharge sequence to be performed on a first set of wordlines of the plurality of wordlines during the read recovery process to alleviate latent read disturb, wherein the early discharge sequence comprises ramping the first set of wordlines from the initial voltage to a ramping voltage while maintaining a second set of wordlines of the plurality of wordlines at the initial voltage, and wherein the ramping voltage is different from $V_{pass}$.

2. The memory device of claim 1, wherein the ramping voltage is a ground voltage.

3. A method comprising:
initiating a read recovery process associated with a block of a memory array, wherein the block comprises a plurality of wordlines at an initial voltage, wherein the initial voltage is a pass-through reset voltage ($V_{pass\_rst}$) having a magnitude less than a pass-through voltage ($V_{pass}$); and causing an early discharge sequence to be performed on a first set of wordlines of the plurality of wordlines during the read recovery process to alleviate latent read disturb, wherein the early discharge sequence comprises ramping the first set of wordlines from the initial voltage to a ramping voltage while maintaining a second set of wordlines of the plurality of wordlines at the initial voltage, and wherein the ramping voltage has a magnitude that is less than or equal to a ground voltage.

4. The method of claim 3, wherein the ramping voltage is a ground voltage.

5. A memory device comprising:
a memory array; and
control logic, operatively coupled with the memory array, to perform operations comprising:

initiating a read recovery process associated with a block of the memory array, wherein the block comprises a plurality of wordlines at a pass-through reset voltage ($V_{pass\_rst}$) having a magnitude less than a pass-through voltage ($V_{pass}$);

causing a first set of wordlines of the plurality of wordlines to be maintained at the pass-through reset voltage during an early discharge sequence of the read recovery process; and causing a second set of wordlines of the plurality of wordlines to be ramped from the pass-through reset voltage to a ramping voltage during the early discharge sequence while the first set of wordlines is maintained at the pass-through reset voltage, wherein the ramping voltage has a magnitude that is less than or equal to a ground voltage.

6. The memory device of claim 5, wherein the ramping voltage is a ground voltage.

* * * * *